United States Patent
Kikuchi et al.

(10) Patent No.: US 12,376,359 B2
(45) Date of Patent: Jul. 29, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takuo Kikuchi, Kamakura (JP); Tatsuya Nishiwaki, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 688 days.

(21) Appl. No.: 17/664,988

(22) Filed: May 25, 2022

(65) Prior Publication Data

US 2023/0088579 A1    Mar. 23, 2023

(30) Foreign Application Priority Data

Sep. 21, 2021    (JP) .................................. 2021-153548

(51) Int. Cl.
   *H10D 64/27*    (2025.01)
   *H10D 30/66*    (2025.01)
   *H10D 62/10*    (2025.01)

(52) U.S. Cl.
   CPC ......... *H10D 64/519* (2025.01); *H10D 30/668* (2025.01); *H10D 62/127* (2025.01); *H10D 64/513* (2025.01); *H10D 64/514* (2025.01)

(58) Field of Classification Search
   CPC .. H10D 30/668; H10D 62/127; H10D 64/513; H10D 64/519; H10D 64/514
   (Continued)

(56) References Cited

U.S. PATENT DOCUMENTS 8,558,308 B1 * 10/2013 Blank ................. H10D 12/481
                                                          438/270
2010/0187543 A1    7/2010 Kawada et al.
(Continued)

FOREIGN PATENT DOCUMENTS

JP    2010-157675 A    7/2010
JP    2015-153988 A    8/2015
(Continued)

OTHER PUBLICATIONS

Japanese Office Action issued Feb. 12, 2025 in Japanese Patent Application No. 2021-153548, (with unedited computer-generated English translation), 7 pages.
(Continued)

*Primary Examiner* — Igwe U Anya
(74) *Attorney, Agent, or Firm* — Oblon, McClelland, Maier & Neustadt, L.L.P.

(57) ABSTRACT

A semiconductor device includes a semiconductor part, first to fourth electrodes, and insulating films. The semiconductor part is provided between the first and second electrodes. The third and fourth electrodes extend into the semiconductor part from a frond side thereof. The third electrodes are surrounded by the fourth electrode. The insulating films are provided between the semiconductor part and the third electrodes, respectively. The fourth electrode includes first to third portions. The first to third portions extend in first to third directions, respectively, along a back surface of the semiconductor part. The third portion links the first and second portions. The second direction is orthogonal to the first direction. The third direction crosses the first and second directions. The third electrodes are arranged to have a minimum spacing of two adjacent insulating films between two third electrodes adjacent to each other respectively in the first and third directions.

18 Claims, 3 Drawing Sheets

(58) Field of Classification Search
USPC .......................................................... 257/330
See application file for complete search history.

(56) References Cited

U.S. PATENT DOCUMENTS

| | | | |
|---|---|---|---|
| 2012/0153386 A1* | 6/2012 | Hirler | H10D 62/314 |
| | | | 257/334 |
| 2016/0064477 A1* | 3/2016 | Blank | H10D 62/126 |
| | | | 257/488 |
| 2019/0097005 A1 | 3/2019 | Blank et al. | |
| 2019/0296116 A1 | 9/2019 | Matsuba et al. | |
| 2021/0288178 A1 | 9/2021 | Kikuchi et al. | |

FOREIGN PATENT DOCUMENTS

| | | |
|---|---|---|
| JP | 2019-165182 A | 9/2019 |
| JP | 2021-34540 A | 3/2021 |
| JP | 2021-145046 A | 9/2021 |

OTHER PUBLICATIONS

Japanese Office Action issued Nov. 22, 2024 in Japanese Patent Application No. 2021-153548, (with unedited computer-generated English translation), 11 pages.

\* cited by examiner

SEMICONDUCTOR DEVICE

CROSS-REFERENCE TO RELATED APPLICATIONS

This application is based upon and claims the benefit of priority from Japanese Patent Application No. 2021-153548, filed on Sep. 21, 2021; the entire contents of which are incorporated herein by reference.

FIELD

Embodiments relate to a semiconductor device.

BACKGROUND

It is desirable for a power control semiconductor device to have a high breakdown voltage.

DETAILED DESCRIPTION

Figure 1:
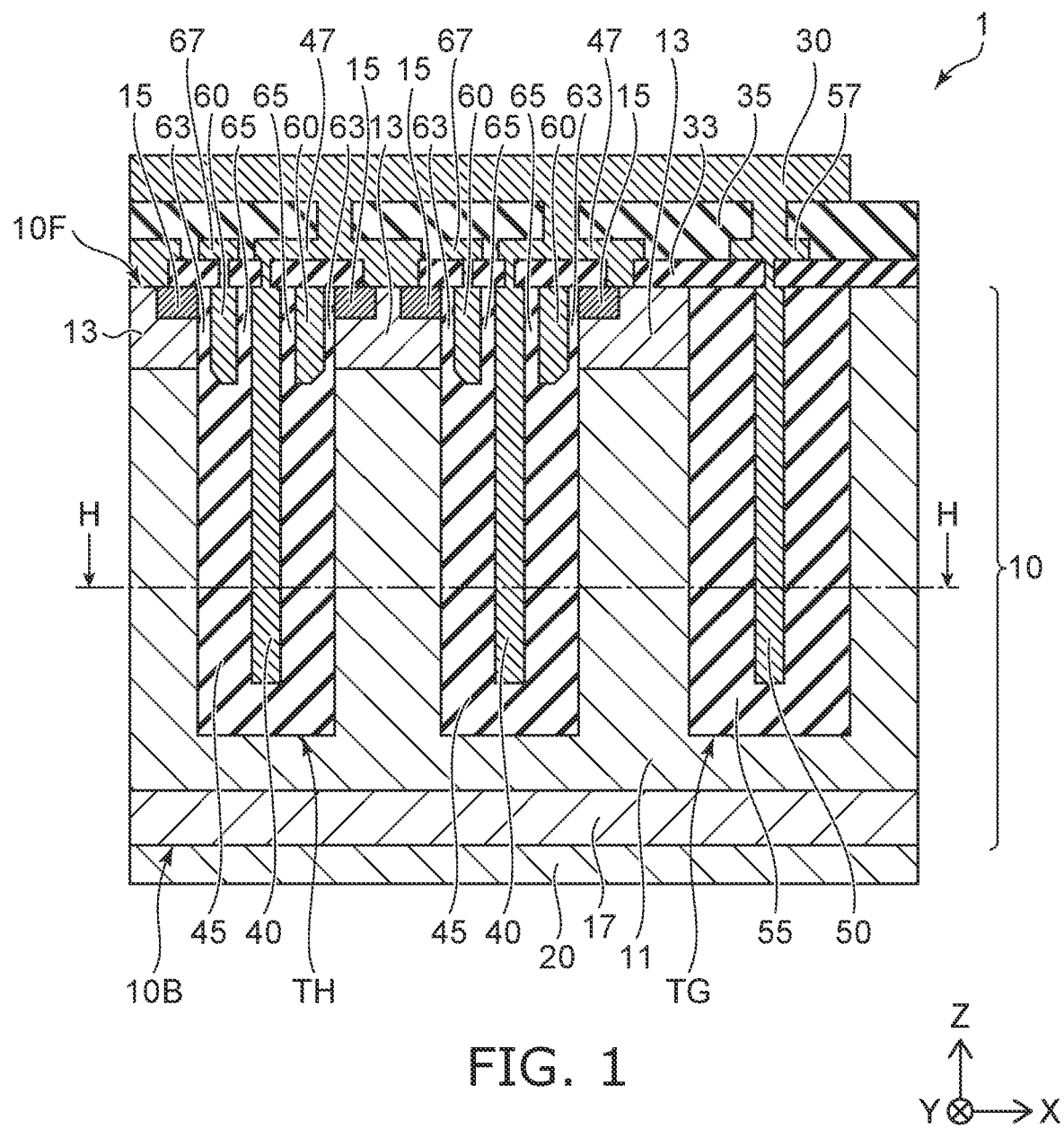
FIG. 1 is a schematic cross-sectional view showing a semiconductor device according to an embodiment.

According to one embodiment, a semiconductor device includes a semiconductor part, first to fourth electrodes, and first and second insulating films. The semiconductor part includes a first semiconductor layer and a second semiconductor layer, the first semiconductor layer being of a first conductivity type, the second semiconductor layer being of a second conductivity type. The first electrode is provided on a back surface of the semiconductor part. The second electrode is provided at a front side of the semiconductor part. The first semiconductor layer extends between the first electrode and the second electrode. The second semiconductor layer is provided between the first semiconductor layer and the second electrode and electrically connected to the second electrode. A plurality of third electrodes extend into the first semiconductor layer through the second semiconductor layer from the front side of the semiconductor part. The plurality of third electrodes are apart from each other in a direction along the back surface of the semiconductor part. The plurality of third electrodes are electrically connected to the second electrode. The fourth electrode extends into the first semiconductor layer from the front side of the semiconductor part. The plurality of the third electrodes are surrounded by the fourth electrode. The fourth electrode is electrically connected to the second electrode. The first insulating film is provided between the semiconductor part and each of the plurality of third electrodes. The first insulating film electrically insulates each of the third electrodes from the semiconductor part. The second insulating film is provided between the semiconductor part and the fourth electrode. The second insulating film electrically insulates the fourth electrode from the semiconductor part. The fourth electrode includes first to third portions. The first portion extends in a first direction along the back surface of the semiconductor part. The second portion extends in a second direction along the back surface and orthogonal to the first direction. The third portion extends in a third direction and links the first and second portions, the third direction being along the back surface and crossing the first and second directions. The plurality of third electrodes are arranged to have a minimum spacing of two adjacent first insulating films between two third electrodes adjacent to each other in the first direction and between another two third electrodes adjacent to each other in the third direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. FIG. 1 is a cross-sectional view along line V-V shown in FIG. 2A. The semiconductor device 1 is, for example, a MOSFET As shown in FIG. 1, the semiconductor device 1 includes a semiconductor part 10, a first electrode 20, a second electrode 30, a third electrode 40, a fourth electrode 50, and a control electrode 60. The semiconductor part 10 is, for example, silicon.

The first electrode 20 is provided on a back surface 10B of the semiconductor part 10. The first electrode 20 is, for example, a drain electrode. The first electrode 20 is, for example, a metal layer that includes nickel (Ni), aluminum (Al), etc.

The second electrode 30 is provided at a front surface 10F side of the semiconductor part 10. The second electrode 30 is, for example, a source electrode. The second electrode 30 is, for example, a metal layer that includes titanium nitride (TiN), tungsten (W), aluminum (Al), etc.

The third electrode 40 is provided in a first trench TH that is provided in the front side of the semiconductor part 10. For example, the first trench TH has a circular or polygonal opening, and has a hole configuration extending in the direction directed from the front side toward the back surface of the semiconductor part 10 (e.g., the −Z direction). The third electrode 40 is electrically insulated from the semiconductor part 10 by a first insulating film 45. The first insulating film 45 covers the inner surface of the first trench TH and is provided between the semiconductor part 10 and the third electrode 40. The first insulating film 45 is, for example, a silicon oxide film.

The fourth electrode 50 is provided in a second trench TG that is provided in the front side of the semiconductor part 10. The second trench TG extends in the direction directed from the front side toward the back surface of the semiconductor part 10 (e.g., the −Z direction). The second trench TG has a trench shape that surrounds an active region in which the multiple third electrodes 40 are provided (see FIG. 2A). In other words, the fourth electrode 50 extends along the opening of the second trench TG and surrounds the active region. The second trench TG is a so-called terminal trench.

The fourth electrode 50 is electrically insulated from the semiconductor part 10 by a second insulating film 55. The second insulating film 55 covers the inner surface of the second trench TG and is provided between the semiconductor part 10 and the fourth electrode 50. The second insulating film 55 is, for example, a silicon oxide film.

The control electrode 60, for example, is provided between the semiconductor part 10 and the third electrode 40 inside the first trench TH. The control electrode 60 is, for example, a gate electrode. The control electrode 60 is provided in the upper portion of the first trench TH. For example, the upper surface of the control electrode 60 is positioned at the vicinity of the opening of the first trench TH. The control electrode 60 is provided inside the first trench TH such that a first distance from the first electrode 20 to the third electrode 40 is shorter than a second distance from the first electrode 20 to the control electrode 60.

The control electrode 60 is electrically insulated from the semiconductor part 10 by a third insulating film 63. The third insulating film 63 is, for example, a gate insulating film. The third insulating film 63 covers the upper portion of the inner surface of the first trench TH and is provided between the semiconductor part 10 and the control electrode 60. The third insulating film 63 is, for example, a silicon oxide film.

The control electrode 60 surrounds the third electrode 40, for example, in a plane parallel to the front surface 10F of the semiconductor part 10. The control electrode 60 is electrically insulated from the third electrode 40 by a fourth insulating film 65. The fourth insulating film 65 is provided between the third electrode 40 and the control electrode 60. The fourth insulating film 65 is, for example, a silicon oxide film.

The semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the first conductivity type. Hereinbelow, the first conductivity type is described as an n-type; and the second conductivity type is described as a p-type.

The first semiconductor layer 11 extends between the first electrode 20 and the second electrode 30. The first semiconductor layer 11 is, for example, an n-type drift layer. The first trench TH and the second trench TG each extend inside the first semiconductor layer 11 from the front side of the semiconductor part 10. The third electrode 40 faces the first semiconductor layer 11 via the first insulating film 45. The fourth electrode 50 faces the first semiconductor layer 11 via the second insulating film 55.

The second semiconductor layer 13 is provided between the first semiconductor layer 11 and the second electrode 30. The second semiconductor layer 13 is, for example, a p-type diffusion layer. The second semiconductor layer 13 faces the control electrode 60 via the third insulating film 63.

Figure 2A:
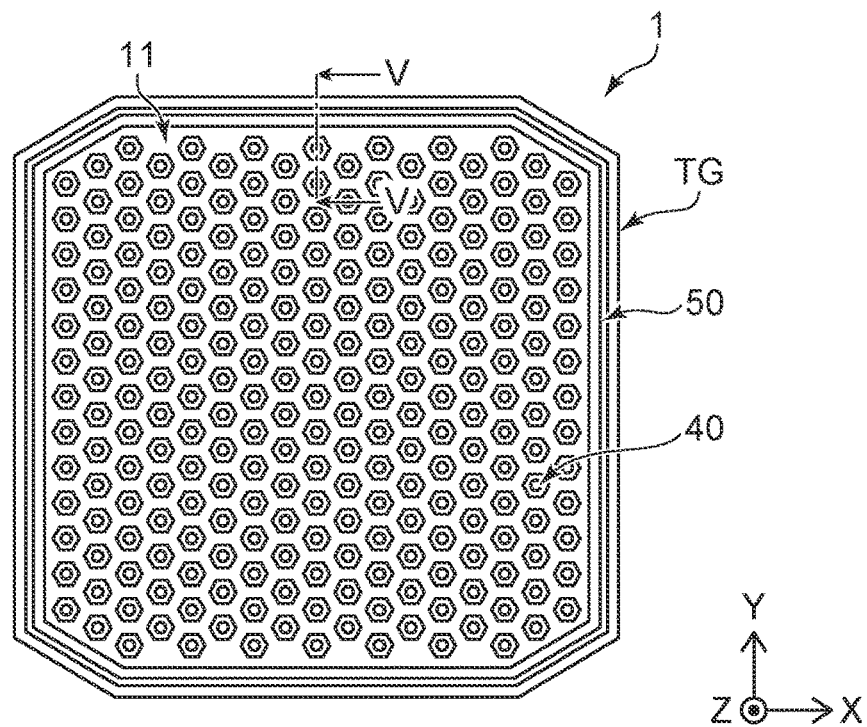
FIGS. 2A and 2B are schematic plan views showing the semiconductor device according to the embodiment.
Figure 2B:
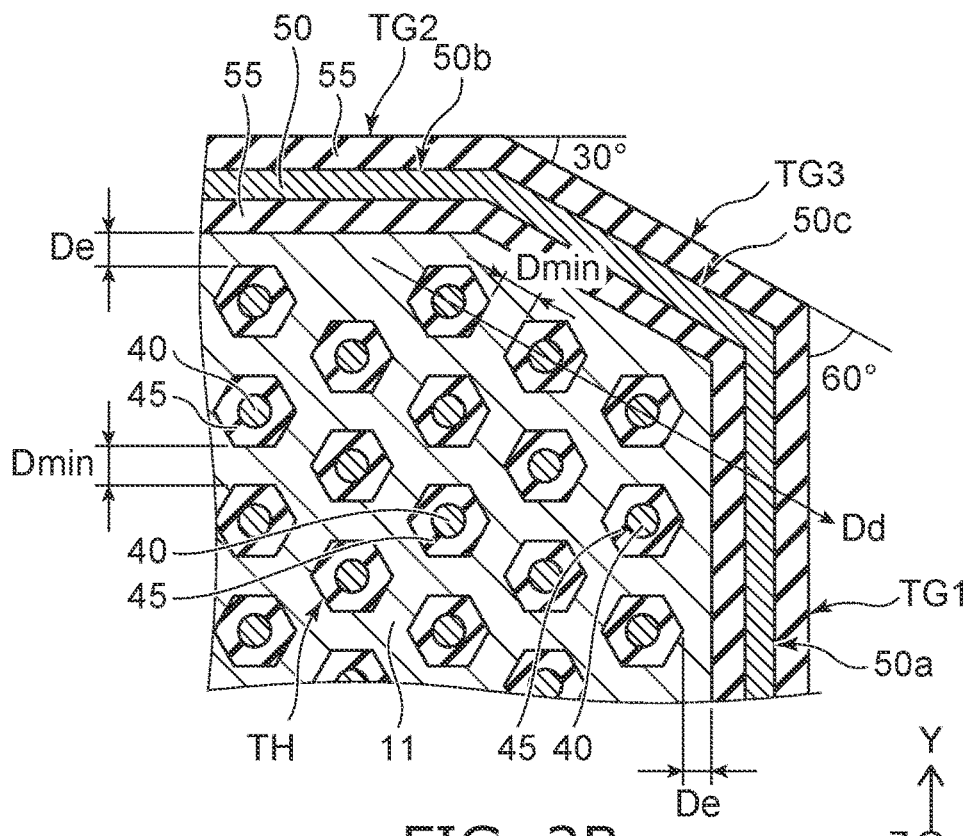

The fourth electrode 50 surrounds the region of the semiconductor part 10 in which the second semiconductor layer 13 is provided (see FIGS. 2A and 2B). The fourth electrode 50 faces the second semiconductor layer 13 via the second insulating film 55. The second semiconductor layer 13, for example, contacts the second insulating film 55.

The third semiconductor layer 15 is partially provided on the second semiconductor layer between the second semiconductor layer 13 and the second electrode 30. The third semiconductor layer 15 contacts the third insulating film 63. The third semiconductor layer 15 is, for example, an n-type source layer.

The fourth semiconductor layer 17 is provided between the first semiconductor layer 11 and the first electrode 20. The fourth semiconductor layer 17 includes a first-conductivity-type impurity with a higher concentration than the first semiconductor layer 11. The fourth semiconductor layer 17 is, for example, an n-type drain layer. The first electrode 20 is electrically connected to the fourth semiconductor layer 17.

The semiconductor device 1 further includes a fifth insulating film 33, a sixth insulating film 35, a first interconnect 47, a second interconnect 57, and a third interconnect 67.

The fifth insulating film 33 and the sixth insulating film 35 are provided between the semiconductor part 10 and the second electrode 30. The fifth insulating film 33 is provided between the semiconductor part 10 and the sixth insulating film 35. The sixth insulating film 35 is provided between the fifth insulating film 33 and the second electrode 30. The fifth insulating film 33 and the sixth insulating film 35 are, for example, inter-layer insulating films. The fifth insulating film 33 and the sixth insulating film 35 are, for example, silicon oxide films.

The fifth insulating film 33 covers the second trench TG, the first trench TH, and the front surface 10F of the semiconductor part 10. The first interconnect 47, the second interconnect 57, and the third interconnect 67 are provided between the fifth insulating film 33 and the sixth insulating film 35.

The first interconnect 47 is electrically connected to the third electrode 40 via a contact hole provided in the fifth insulating film 33. The second interconnect 57 is electrically connected to the fourth electrode 50 via another contact hole provided in the fifth insulating film 33. The third interconnect 67 is electrically connected to the control electrode 60 via yet another contact hole provided in the fifth insulating film 33. The first interconnect 47 also is electrically connected to the second and third semiconductor layers 13 and 15 via another contact hole provided in the fifth insulating film 33.

The second electrode 30 is connected to the first and second interconnects 47 and 57 via contact holes provided in the sixth insulating film 35. Thereby, the second electrode 30 is electrically connected to the third and fourth electrodes 40 and 50. The second electrode 30 also is electrically connected to the second and third semiconductor layers 13 and 15.

FIGS. 2A and 2B are schematic plan views showing the semiconductor device 1 according to the embodiment. FIG. 2A is a cross-sectional view along line H-H shown in FIG. 1. FIG. 2B is a partial cross-sectional view showing a portion in FIG. 2A.

As shown in FIG. 2A, the second trench TG surrounds the region (the active region) in which the multiple third electrodes 40 are provided. The outer edge of the second trench TG is, for example, a quadrilateral of which the four corners are beveled. The fourth electrode 50 extends along the second trench TG and surrounds the multiple third electrodes 40. The third electrodes 40 have, for example, columnar shapes extending in the Z-direction. The fourth electrode 50 has, for example, a plate shape extending in the Z-direction and in directions parallel to the back surface 10B of the semiconductor part 10.

The third electrodes 40 are arranged, for example, in the Y-direction. Multiple columns of the third electrodes 40 arranged in lines along the Y-direction, and the lines of the multiple columns are arranged in the X-direction. The third electrodes 40 is arranged such that the space between the third electrodes 40 adjacent to each other in the Y-direction is provided next to one of the third electrode 40 in the X-direction.

FIG. 2B is a plan view showing one corner of the second trench TG. As shown in FIG. 2B, the first trench TH has, for example, a regular hexagonal cross-sectional shape. The third electrode 40 is provided at, for example, the center of the regular hexagon.

The multiple third electrodes 40 are provided so that the spacing between two first insulating films 45 adjacent to each other in the Y-direction is a minimum spacing Dmin. Also, the multiple third electrodes 40 are provided so that the spacing also is the minimum spacing Dmin between two first insulating films 45 adjacent to each other in, for example, an oblique direction Dd that crosses the X-direction and the Y-direction.

Also, a spacing De is provided between the second trench TG and the first trenches TH that are most proximate to the second trench TG. The spacing De is a uniform spacing and, for example, equal to the minimum spacing Dmin.

The second trench TG includes, for example, a first portion TG1, a second portion TG2, and a third portion TG3. The first portion TG1 extends in the Y-direction. The second portion TG2 extends in the X-direction. The third portion TG3 extends in the oblique direction Dd and links the first portion TG1 and the second portion TG2. For example, the first portion TG1 is linked to the third portion TG3 to have an exterior angle of 60°. For example, the second portion TG2 is linked to the third portion TG3 to have an exterior angle of 30°.

The fourth electrode 50 that is provided in the second trench also includes a first portion 50a, a second portion 50b, and a third portion 50c. The first portion 50a extends in the Y-direction. The second portion 50b extends in the X-direction. The third portion 50c extends in the oblique direction Dd and links the first portion 50a and the second portion 50b.

The multiple third electrodes 40 include, for example, three third electrodes 40 that are most proximate to the third portion 50c of the fourth electrode 50. The three third electrodes 40 that are most proximate to the third portion 50c of the fourth electrode 50 are arranged in the oblique direction Dd. Embodiments are not limited to such an example; for example, it is sufficient for at least two third electrodes 40 to be most proximate to the third portion 50c of the fourth electrode 50 and to be arranged in the oblique direction Dd.

Figure 3:
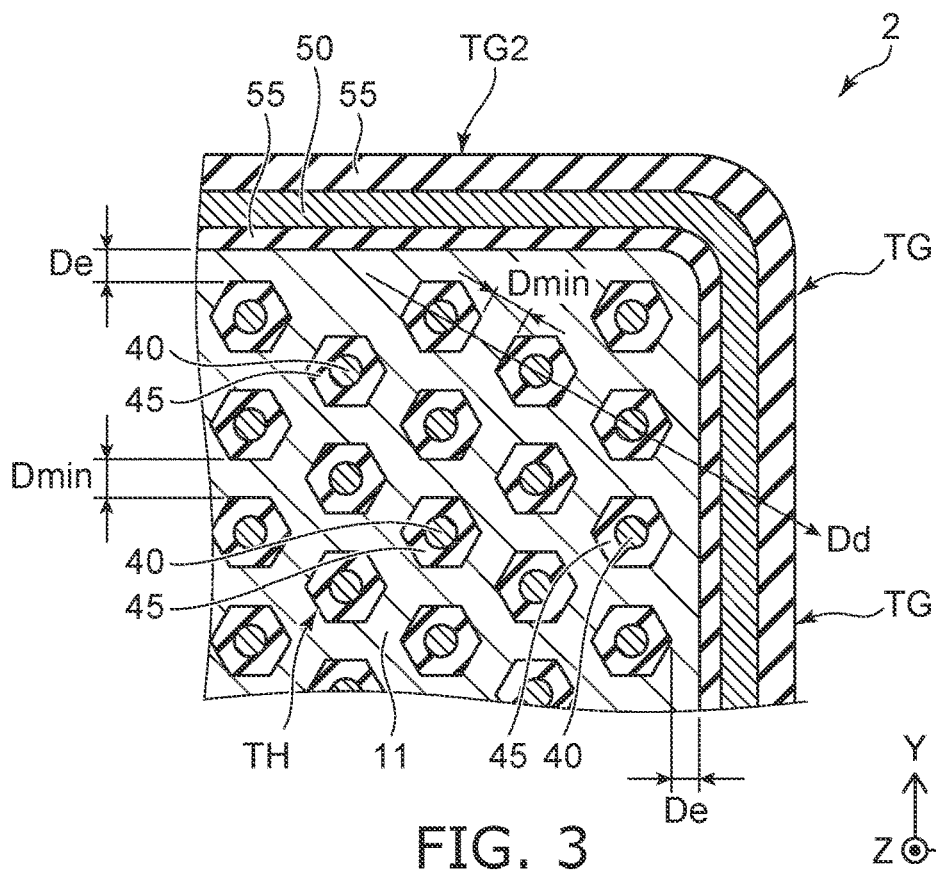
FIG. 3 is a schematic plan view showing a semiconductor device 2 according to a comparative example.

FIG. 3 is a schematic plan view showing a semiconductor device 2 according to a comparative example. FIG. 3 is a plan view corresponding to FIG. 2B.

In the semiconductor device 2, one first trench TH faces a corner of the second trench TG. In other words, the second trench TG of the semiconductor device 2 does not include the third portion TG3 that extends in the oblique direction Dd (see FIG. 2B).

Thus, the corner of the second trench TG of the semiconductor device 2 is bent 90°. The semiconductor device 2 has a shape in which electric field concentration easily occurs at the corner at the turn-off state.

Figure 4:
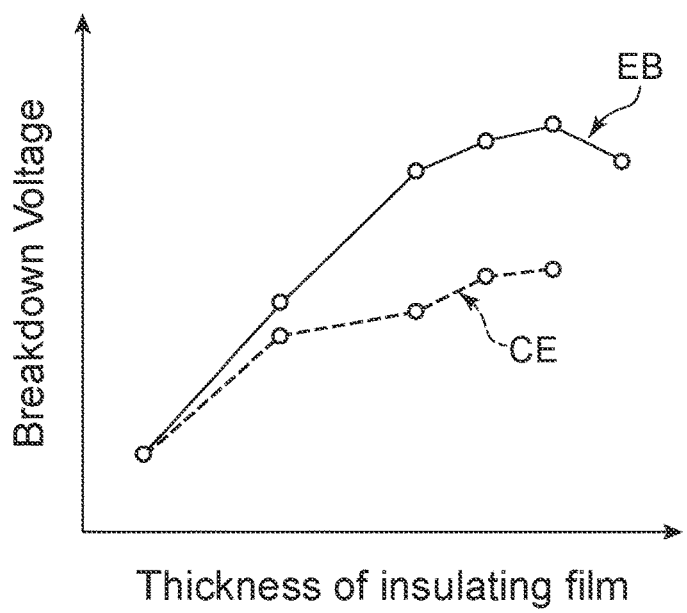
FIG. 4 is a graph showing a characteristic of the semiconductor device according to the embodiment.

FIG. 4 is a graph showing a characteristic of the semiconductor device 1 according to the embodiment. The horizontal axis is the film thickness of the second insulating film 55. The vertical axis is the breakdown voltage. "EB" shown in FIG. 4 shows the characteristic of the semiconductor device 1. "CE" shows the characteristic of the semiconductor device 2 of the comparative example.

When the breakdown voltage in the active region is increased by, for example, preferably setting the minimum spacing Dmin between the adjacent first trenches TH, the breakdown voltages of the semiconductor devices 1 and 2 may depend on the breakdown voltage of the termination region in which the second trench TG is provided.

As shown in FIG. 4, by increasing the film thickness of the second insulating film 55 in the second trench TG, the electric field value is reduced at the interface between the first semiconductor layer 11 and the second insulating film 55, and the breakdown voltage of the termination region is increased.

The breakdown voltage of the termination region also is affected by, for example, the electric field concentration at the corner of the second trench TG. The second trench TG of the semiconductor device 1 includes the third portion TG3 at the corner (see FIG. 2B). Therefore, the electric field concentration at the second trench TG is relaxed in the semiconductor device 1, and the breakdown voltage of the semiconductor device 1 is greater than the breakdown voltage of the semiconductor device 2.

Thus, in the semiconductor device 1 according to the embodiment, the breakdown voltage can be increased by including the third portion TG3 at the corner of the second trench TG.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a semiconductor part including a first semiconductor layer and a second semiconductor layer, the first semiconductor layer being of a first conductivity type, the second semiconductor layer being of a second conductivity type;
    a first electrode provided on a back surface of the semiconductor part;
    a second electrode provided at a front side of the semiconductor part, the first semiconductor layer extending between the first electrode and the second electrode, the second semiconductor layer being provided between the first semiconductor layer and the second electrode and electrically connected to the second electrode;
    a plurality of third electrodes extending into the first semiconductor layer through the second semiconductor layer from the front side of the semiconductor part, the plurality of third electrodes being apart from each other in a direction along the back surface of the semiconductor part, the plurality of third electrodes being electrically connected to the second electrode;
    a fourth electrode extending into the first semiconductor layer from the front side of the semiconductor part, the plurality of the third electrodes being surrounded by the fourth electrode, the fourth electrode being electrically connected to the second electrode;
    a first insulating film provided between the semiconductor part and each of the plurality of third electrodes, the first insulating film electrically insulating each of the third electrodes from the semiconductor part; and a second insulating film provided between the semiconductor part and the fourth electrode, the second insulating film electrically insulating the fourth electrode from the semiconductor part, the fourth electrode including first to third portions, the first portion extending in a first direction along the back surface of the semiconductor part, the second portion extending in a second direction along the back surface and orthogonal to the first direction, the third portion extending in a third direction and linking the first and second portions, the third direction being along the back surface and crossing the first and second directions, the plurality of third electrodes being arranged to have a minimum spacing of two adjacent first insulating films between two third electrodes adjacent to each other in the first direction and between another two third electrodes adjacent to each other in the third direction.

2. The device according to claim 1, wherein
the plurality of third electrodes is arranged to provide a uniform spacing of the first insulating film and the second insulating film between the fourth electrode and a plurality of the third electrodes that are most proximate to the fourth electrode.

3. The device according to claim 2, wherein
the spacing between the first insulating film and the second insulating film is equal to the minimum spacing of the first insulating films between the two adjacent third electrodes.

4. The device according to claim 1, wherein
the plurality of third electrodes is provided respectively in a plurality of first trenches at the front side of the semiconductor part,
the plurality of first trenches extends in a fourth direction,
the fourth direction is directed from the second electrode toward the first electrode, and
the plurality of first trenches have circular or polygonal openings at the front side of the semiconductor part.

5. The device according to claim 4, wherein
the third electrode has a columnar shape extending in the fourth direction.

6. The device according to claim 1, wherein
the fourth electrode is provided inside a second trench, and
the second trench has a trench shape extending along the front side of the semiconductor part.

7. The device according to claim 6, wherein
the fourth electrode has a plate shape extending in a fourth direction and in the first to third directions, and
the fourth direction is directed from the first electrode toward the second electrode.

8. The device according to claim 1, wherein
the third direction crosses the first direction to have an exterior angle of 60° or 30°.

9. The device according to claim 1, wherein
the plurality of third electrodes includes at least two third electrodes most proximate to the third portion of the fourth electrode, and
the at least two third electrodes are arranged in the third direction.

10. The device according to claim 9, wherein
three third electrode among the plurality of third electrodes is most proximal to the third portion of the fourth electrode.

11. The device according to claim 1, wherein
the fourth electrode surrounds the second semiconductor layer of the semiconductor part.

12. The device according to claim 11, wherein
the second semiconductor layer contacts the second insulating film and faces the fourth electrode via the second insulating film.

13. The device according to claim 1, wherein
the fourth electrode faces the first semiconductor layer via the second insulating film.

14. The device according to claim 1, further comprising:
a control electrode provided between the second semiconductor layer and each of the third electrodes;
a third insulating film provided between the second semiconductor layer and the control electrode; and
a fourth insulating film provided between each of the third electrodes and the control electrode.

15. The device according to claim 14, wherein
a first distance from the first electrode to the third electrode is shorter than a second distance from the first electrode to the control electrode, and
the third electrode faces the first semiconductor layer via the first insulating film.

16. The device according to claim 14, wherein
the semiconductor part further includes a third semiconductor layer of the first conductivity type, and
the third semiconductor layer contacts the third insulating film and is partially provided on the second semiconductor layer between the second semiconductor layer and the second electrode.

17. The device according to claim 1, further comprising:
a fifth insulating film provided between the semiconductor part and the second electrode;
a sixth insulating film provided between the fifth insulating film and the second electrode;
a first interconnect provided between the fifth insulating film and the sixth insulating film and electrically connected to the second and third electrodes;
a second interconnect provided between the fifth insulating film and the sixth insulating film and electrically connected to the second and fourth electrodes; and
a third interconnect provided between the fifth insulating film and the sixth insulating film and electrically connected to the control electrode.

18. The device according to claim 17, wherein
the first interconnect is electrically connected to the second and third semiconductor layers.

* * * * *